(12) United States Patent
Takata et al.

(10) Patent No.: US 8,498,056 B2
(45) Date of Patent: Jul. 30, 2013

(54) SYNTHESIZED SILICA GLASS FOR OPTICAL COMPONENT

(75) Inventors: Masaaki Takata, Tokyo (JP); Long Shao, Tokyo (JP); Kei Iwata, Tokyo (JP); Tomonori Ogawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/367,780

(22) Filed: Feb. 7, 2012

(65) Prior Publication Data

US 2012/0182622 A1 Jul. 19, 2012

Related U.S. Application Data

(63) Continuation of application No. PCT/JP2009/064067, filed on Aug. 7, 2009.

(51) Int. Cl.
*G02B 27/12* (2006.01)
*C03B 11/08* (2006.01)
*C03B 23/22* (2006.01)

(52) U.S. Cl.
USPC .............................................. 359/639; 65/37

(58) Field of Classification Search
USPC ....................................... 359/639, 642; 65/37
See application file for complete search history.

(56) References Cited

U.S. PATENT DOCUMENTS

| 6,480,518 | B1 | 11/2002 | Fujinoki et al. | |
|---|---|---|---|---|
| 6,769,273 | B1 | 8/2004 | Nakagawa et al. | |
| 7,312,170 | B2 * | 12/2007 | Nishimura et al. | 501/54 |
| 2005/0217318 | A1 | 10/2005 | Kuhn et al. | |
| 2008/0292882 | A1 | 11/2008 | Agata et al. | |
| 2009/0239732 | A1 | 9/2009 | Kuhn et al. | |

FOREIGN PATENT DOCUMENTS

| EP | 1 033 350 A1 | 9/2000 |
|---|---|---|
| EP | 1 586 544 A1 | 10/2005 |
| JP | 2003-176143 | 6/2003 |
| JP | 2003-221245 | 8/2003 |
| JP | 2003-238195 | 8/2003 |

(Continued)

OTHER PUBLICATIONS

International Search Report issued Oct. 20, 2009 in PCT/JP2009/064067 filed Aug. 7, 2009.

(Continued)

*Primary Examiner* — James Greece
(74) *Attorney, Agent, or Firm* — Oblon, Spivak, McClelland, Maier & Neustadt, L.L.P.

(57) ABSTRACT

The present invention provides a synthetic silica glass for an optical member in which not only a fast axis direction in an optical axis direction is controlled, and a birefringence in an off-axis direction is reduced, but a magnitude of a birefringence in the optical axis direction is controlled to an arbitrary value, such that an average value of a value $BR \cos 2\theta_{xy}$ defined from a birefringence BR and a fast axis direction $\theta_{xy}$ as measured from a parallel direction to the principal optical axis direction is defined as an average birefringence $AveBR \cos 2\theta_{xy}$, and when a maximum value of a birefringence measured from a vertical direction to the principal optical axis direction of the optical member is defined as a maximum birefringence $BR_{max}$ in an off-axis direction, the following expression (1-1) and expression (2-1) are established:

$$-1.0 \leq AveBR \cos 2\theta_{xy} < 0.0 \quad (1\text{-}1)$$

$$0.0 \leq BR_{max} \leq 1.0 \quad (2\text{-}1).$$

10 Claims, 5 Drawing Sheets

FOREIGN PATENT DOCUMENTS

| | | |
|---|---|---|
| JP | 2004-026587 | 1/2004 |
| JP | 2004-269287 | 9/2004 |
| JP | 2005-336047 | 12/2005 |
| JP | 2007-223888 | 9/2007 |
| JP | 2007-223889 | 9/2007 |
| JP | 2008-077733 | 4/2008 |
| WO | WO 2007/086611 | 8/2007 |
| WO | WO 2007/086617 | 8/2007 |

OTHER PUBLICATIONS

Notification of Reasons for Refusal issued Dec. 20, 2011 in Patent Application No. 2008-092525 filed Mar. 31, 2008.
The Extended European Search Report issued Jan. 2, 2013, in Application No. / Patent No. 09848070.0-2111 / 2463245 PCT/JP2009064067.

* cited by examiner

SYNTHESIZED SILICA GLASS FOR OPTICAL COMPONENT

TECHNICAL FIELD

The present invention relates to a technology regarding a synthetic silica glass for optical member of an exposure apparatus, and in particular, it relates to a birefringence and distribution control of a fast axis thereof.

BACKGROUND ART

Following microfabrication of a circuit pattern of a semiconductor device in recent years, it is required to increase a numerical aperture of a projection lens optical system in an exposure apparatus. The higher the numerical aperture, the shallower the incident angle of pattern diffracted light onto a wafer surface is. That is, the light is made incident at an angle closely parallel to the wafer surface. In imaging at such a shallow incident angle, deterioration of an image contrast by p-polarization, namely polarization in a parallel direction to the plane as defined by a locus of two or more incident light beams becomes remarkable. For that reason, it is important to introduce only s-polarization into the wafer surface without including a p-polarization component. In this way, in fine pattern imaging utilizing a technology for increasing the numerical aperture, it is extremely important to control the polarization of diffracted light for the purpose of enhancing the contrast.

In consequence, birefringence greatly influences controllability of the polarization and deteriorates an imaging characteristic, and therefore, the higher the numerical aperture of an exposure apparatus, the lower the birefringence is required for an optical material to be used therein. On the other hand, in an optical system of the exposure apparatus, an optical member composed of plural synthetic silica glasses and other materials is used. For that reason, the birefringence related to the imaging characteristic on an actual wafer surface is correctly corresponding to one obtained by integrating birefringence of all of optical members through which diffracted light generated from a reticle passes to the wafer (this birefringence will be hereinafter referred to as "optical path integrated birefringence"). In order to decrease this optical path integrated birefringence, besides (1) a method of reducing the birefringence of an individual optical member contained in the same optical system to a considerable extent, there is also (2) a method of reducing the birefringence through compensation utilizing a combination with a fast axis direction in plural optical members contained in the same optical system.

As the foregoing method (1), in order to reduce the birefringence of a synthetic silica glass which is used for the individual optical member, it would be better to remove a residual stress in the synthetic silica glass. In a manufacturing step, it is known to be effective to perform an appropriate cooling treatment on a transparent glass body molded so as to have appropriate size and shape. Examples of the appropriate cooling treatment include a method in which not only for the purpose of releasing a residual stress in the synthetic silica glass, the synthetic silica glass is held at a high temperature for a sufficiently long period of time, but for the purpose of not generating newly a residual stress at the time of cooling, a cooling rate is made sufficiently low; a method in which reversely, for the purpose of positively utilizing a residual stress generated at the time of cooling to obtain a desired residual stress distribution, a cooling rate is made slightly fast; and so on. The former method involves such a drawback that since the time required for the cooling treatment becomes long, the productivity is conspicuously lowered, or contamination with impurities from the treatment environment is easily caused, or the like.

On the other hand, the foregoing method (2) is hereunder explained while taking the case of an optical system composed of two optical members as an example. In the case having such a distribution that not only birefringence of two optical members A and B each composed of a synthetic silica glass are identical, but the fast axis directions thereof are orthogonal to each other, since the fast axis of the optical member A and the fast axis of the optical member B are superimposed in the same direction, the birefringence of the two optical members are compensated each other, and the optical path integrated birefringence becomes zero.

In consequence, in order to reduce the optical path integrated birefringence of an optical system composed of plural optical members, it is effective to utilize the foregoing method (2) in addition to the foregoing method (1). In particular, in view of the fact that a requirement for reducing the birefringence of an individual optical member is reaching an extremely severe level from the standpoint of manufacture, it is expected that importance of the method (2) will increase in the future, and hence, it is necessary to control the fast axis direction of an optical member.

In view of the foregoing requirements, for example, Patent Documents 1 and 2 propose a manufacturing method in which the fast axis direction of a synthetic silica glass is controlled. In such a method, by controlling a concentration distribution of an OH group contained in the synthetic silica glass, a desired distribution of the fast axis direction is obtained.

On the other hand, in recent years, the following problems have been pointed out. All of the foregoing values of birefringence are a value regarding a shape, in general, a simple cylinder, during the shipment of materials by optical materials manufacturers; however, there is encountered such a problem that there may be the case where the birefringence measured in a state of being processed into a lens shape changes from a value before processing. In the case where an amount of change in the birefringence before and after processing is large, since the birefringence is different from that as previously assumed by an exposure apparatus manufacturer at the time of material purchase, a desired optical path integrated birefringence is not obtained. As causes of this change in the birefringence before and after processing, though an influence by a processing strain generated at the time of lens processing, or the like may be considered, a hypothesis that the change is caused by a stress distribution state in a thickness direction of the synthetic silica glass is the most influential at present.

The foregoing hypothesis is a theory that in the case where a portion with a locally high stress is included in a thickness direction, a large change is caused in the birefringence after processing. The conventional birefringence refers to a birefringence observed from a parallel direction to a principal optical axis direction, namely this is a value integrated in a thickness direction of the synthetic silica glass, and therefore, a stress state at each point in the thickness direction was unclear. For that reason, in order to reduce the change of the birefringence after lens shape processing, it is said to be necessary to reduce the stress at each point in the thickness direction of the synthetic silica glass. According to the measurement of a birefringence that is a means for measuring the stress, only a value integrated in the optical path of the measured light is obtained, and therefore, it is originally difficult to actually measure a local stress value at each three-dimensional point of the synthetic silica glass. However, as a substitution there for, a birefringence measured from a vertical direction to the principal optical axis direction, namely a birefringence in an off-axis direction, may be an index in view of supposing an amount of change in the birefringence after lens shape processing. It is said that the smaller this birefringence in the off-axis direction, the smaller the amount of change in the birefringence after processing is. From this fact, in optical members used for exposure apparatus in recent years, a reduction of the birefringence of a vertical component to the principal optical axis direction is also required.

Background Art Documents

Patent Document
Patent Document 1: JP-A-2007-223888
Patent Document 2: JP-A-2007-223889

SUMMARY OF THE INVENTION

Problems that the Invention is to Solve

As described above, in synthetic silica glasses for optical member, control of the fast axis direction in the optical axis direction and reduction of a birefringence in the off-axis direction have been required.

However, in an optical system in an actual exposure apparatus, besides a synthetic silica glass, crystal optical members such as quartz crystal, calcium fluoride, a high refractive index optical material, and the like are also used. Furthermore, optical members such as an antireflection film of the optical member surface for the purpose of suppressing a loss to be caused due to reflection on the optical member surface, and the like are also included. Each of the optical members has a different birefringence from each other. In the case of a crystal system optical member or an optical member obtained by film formation of an antireflection film or the like on the surface, it is impossible to achieve the reduction more than this, and there are a lot of members having a true birefringence with a magnitude to an optically non-negligible extent. Therefore, in actual apparatuses, it is necessary to take into consideration all of birefringence of such plural kinds of optical members upon being integrated. In consequence, in the case of compensating the foregoing true birefringence of the optical member, an optical member composed of a synthetic silica glass is required to present a fast axis in an orthogonal direction to a fast axis of the true birefringence and also have a birefringence with a magnitude which is not zero but limited to a certain extent so as to being balanced with the true birefringence. Also, an optical system of the exposure apparatus is constituted of several tens optical members, and there may be the case where a value of birefringence required for the optical member is different depending upon a site within the optical system.

In view of the foregoing matters, in optical members composed of a synthetic silica glass, which are used for exposure apparatus in recent years, not only control of a fast axis direction in the optical axis direction and reduction of a birefringence in the off-axis direction, but fine control of a magnitude of birefringence in the optical axis direction to an arbitrary value which is not zero is required.

However, in synthetic silica glasses for optical member, it was hitherto extremely difficult to control such a birefringence to an arbitrary value. Then, a problem of the present invention is to provide a synthetic silica glass for optical member in which not only a fast axis direction in an optical axis direction is controlled, and a birefringence in an off-axis direction is reduced, but a magnitude of a birefringence in the optical axis direction is controlled to an arbitrary value.

Means for Solving the Problems

The present invention relates to the followings.
[1] A synthetic silica glass for optical member to be used within an optical apparatus using light having a wavelength of 250 nm or less as a light source,
wherein, in an optically effective area within a vertical plane to a principal optical axis direction of the optical member, an average value of a value BR cos $2\theta_{xy}$ defined from a birefringence BR and a fast axis direction $\theta_{xy}$ as measured from a parallel direction to the principal optical axis direction is defined as an average birefringence AveBR cos $2\theta_y$, and
when a maximum value of a birefringence measured from a vertical direction to the principal optical axis direction of the optical member is defined as a maximum birefringence $BR_{max}$ in an off-axis direction, the following expression (1-1) and expression (2-1) are established, and
a refractive index distribution Δn in the principal optical axis direction is $2\times10^{-6}$ nm/cm or less, and a refractive index distribution Δn in the off-axis direction is $5\times10^{-6}$ nm/cm or less,
provided that each of the numerical values of BR, $\theta_{xy}$, $BR_{max}$ and Δn is a measured value at a wavelength of 633 nm, and a unit of the birefringence is nm/cm:

$$-1.0 \leq \text{AveBR cos } 2\theta_{xy} < 0.0 \tag{1-1}$$

$$0.0 \leq BR_{max} \leq 1.0 \tag{2-1}$$

[2] A synthetic silica glass for optical member to be used within an optical apparatus using light having a wavelength of 250 nm or less as a light source,
wherein, in an optically effective area within a vertical plane to a principal optical axis direction of the optical member, an average value of a value BR cos $2\theta_{xy}$ defined from a birefringence BR and a fast axis direction $\theta_{xy}$ as measured from a parallel direction to the principal optical axis direction is defined as an average birefringence AveBR cos $2\theta_{xy}$, and
when a maximum value of a birefringence measured from a vertical direction to the principal optical axis direction of the optical member is defined as a maximum birefringence $BR_{max}$ in an off-axis direction, the following expression (1-2) and expression (2-1) are established, and
a refractive index distribution Δn in the principal optical axis direction is $2\times10^{-6}$ nm/cm or less, and a refractive index distribution Δn in the off-axis direction is $5\times10^{-6}$ nm/cm or less,
provided that each of the numerical values of BR, $\theta_{xy}$, $BR_{max}$ and Δn is a measured value at a wavelength of 633 nm, and a unit of the birefringence is nm/cm:

$$0.0 < \text{AveBR cos } 2\theta_{xy} \leq 1.0 \tag{1-2}$$

$$0.0 \leq BR_{max} \leq 1.0 \tag{2-1}$$

[3] The synthetic silica glass for optical member according to [1], wherein the average birefringence AveBR cos $2\theta_{xy}$ in the optical axis direction and the maximum birefringence $BR_{max}$ in the off-axis direction satisfy the following expression (1-3) and expression (2-2), respectively:

$$-0.3 \leq \text{AveBR cos } 2\theta_{xy} < 0.0 \tag{1-3}$$

$$0.0 \leq BR_{max} \leq 0.5 \tag{2-2}$$

[4] The synthetic silica glass for optical member according to [2], wherein the average birefringence AveBR cos $2\theta_{xy}$ in the optical axis direction and the maximum birefringence BR$_{max}$ in the off-axis direction satisfy the following expression (1-4) and expression (2-2), respectively:

$$0.0 < \text{AveBR} \cos 2\theta_{xy} \leq 0.3 \quad (1\text{-}4)$$

$$0.0 \leq \text{BR}_{max} \leq 0.5 \quad (2\text{-}2).$$

[5] A method for manufacturing the synthetic silica glass for optical member according to any one of [1] to [4], the method comprising:

a treatment of cooling from any temperature of 900° C. or higher and 1,200° C. or lower to any temperature of 850° C. or lower at a cooling rate of 3° C./hour or more and 100° C./hour or less.

[6] A method for manufacturing the synthetic silica glass for optical member according to [1] or [3], the method comprising:

a treatment of cooling from any temperature of 1,020° C. or higher and 1,200° C. or lower to any temperature of 850° C. or lower at a cooling rate of 3° C./hour or more and 100° C./hour or less.

[7] A method for manufacturing the synthetic silica glass for optical member according to [3], the method comprising:

a treatment of holding a porous silica glass body having a bulk density of 0.30 g/cm³ or more and 0.45 g/cm³ or less at a temperature of 1,100° C. or higher and 1,250° C. or lower in a reduced pressure atmosphere of 50 Pa or less for 60 hours or more, thereby achieving dehydration; and a treatment of cooling a transparent silica glass molded article from any temperature of 1,020° C. or higher and 1,050° C. or lower to any temperature of 850° C. or lower at a cooling rate of 3° C./hour or more and 100° C./hour or less.

[8] A method for manufacturing the synthetic silica glass for optical member according to [2] or [4], the method comprising:

a treatment of cooling from any temperature of 900° C. or higher and lower than 1,020° C. to any temperature of 850° C. or lower at a cooling rate of 3° C./hour or more and 100° C./hour or less.

[9] A method for manufacturing the synthetic silica glass for optical member according to [4], the method comprising:

a treatment of holding a porous silica glass body having a bulk density of 0.20 g/cm³ or more and 0.30 g/cm³ or less at a temperature of 1,100° C. or higher and 1,250° C. or lower in a reduced pressure atmosphere of 50 Pa or less for 40 hours or more and 60 hours or less, thereby achieving dehydration; and a treatment of cooling a transparent silica glass molded article from any temperature of 1,050° C. or higher and 1,100° C. or lower to any temperature of 850° C. or lower at a cooling rate of 3° C./hour or more and 100° C./hour or less.

Advantage of the Invention

According to the synthetic silica glass for optical member of the present invention, not only a fast axis direction in an optical axis direction is controlled, and a birefringence in an off-axis direction is reduced, but a magnitude of a birefringence in the optical axis direction is controlled to an arbitrary value.

According to the method for manufacturing a synthetic silica glass for optical member of the present invention, not only a fast axis direction in an optical axis direction of the synthetic silica glass for optical member is controlled, and a birefringence in an off-axis direction is reduced, but a magnitude of a birefringence in the optical axis direction is controlled to an arbitrary value.

MODE FOR CARRYING OUT THE INVENTION

First of all, the definition of a fast axis of a synthetic silica glass serving as a material of an optical member according to the present invention is hereunder explained. In a synthetic silica glass for optical member that is subjective in the present invention, the fast axis includes a fast axis in a principal optical axis direction and a fast axis in an off-axis direction.

Figure 1A:
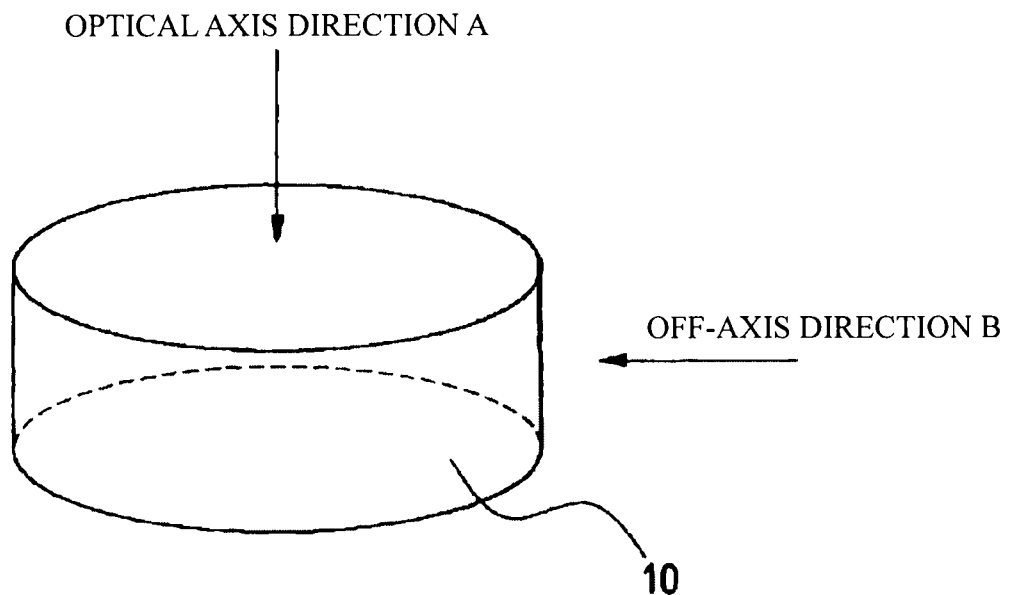
FIG. 1A is a perspective view of a synthetic silica glass.
Figure 1B:
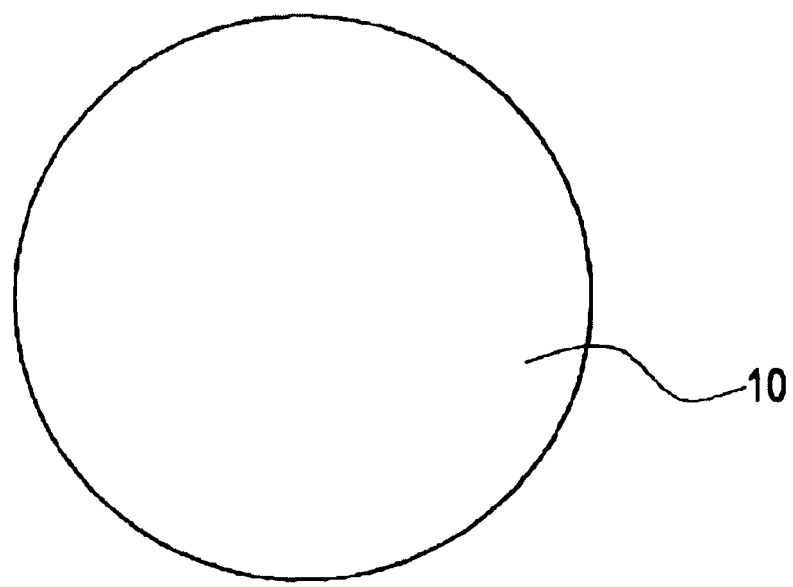
FIG. 1B is a plan view of a synthetic silica glass seen from an optical axis direction.
Figure 1C:
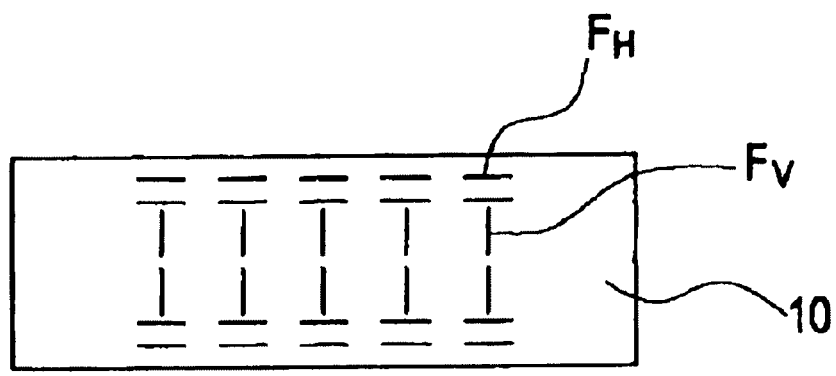
FIG. 1C is a plan view of a synthetic silica glass seen from an off-axis direction.

Each of FIGS. 1A to 1C shows an example of a synthetic silica glass for optical member. The synthetic silica glass is a silica glass which is chemically synthesized utilizing a gas phase reaction or the like, and it is suitably used for a variety of optical members such as substrates for photomask, lenses for scanner, and the like because it has excellent chemical and physical properties such as a low expansion coefficient, a high transmittance, high chemical stability, and the like. Assuming the use for a lens for scanner as an application to which the present invention especially pays attention, the synthetic silica glass for optical member is approximately a cylinder as shown in FIGS. 1A to 1C.

Then, as shown in FIG. 1A, a vertical direction to the upper and lower surfaces of the cylinder is defined as a principal optical axis direction, and in a section including a central axis of the cylinder, a vertical direction to the principal optical axis direction is defined as an off-axis direction. That is, in FIG. 1A, an arrow A direction is corresponding to the principal optical axis direction, and an arrow B direction is corresponding to the off-axis direction.

FIG. 1B shows an example of a distribution of a fast axis in the off-axis direction. The fast axis in the off-axis direction means a fast axis observed from a parallel direction to the off-axis. In FIG. 1C, in the neighborhood of each of the upper and lower surfaces of the cylinder, a fast axis $F_H$ is observed in a parallel direction to the upper and lower surfaces, namely a vertical direction to the principal optical axis direction; whereas in the vicinity of a center in a height direction far from the upper and lower surfaces, a fast axis $F_V$ is observed in a vertical direction to the upper and lower surfaces, namely a parallel direction to the principal optical axis direction.

However, FIG. 1C is an example to the bitter end, and there are also present synthetic silica glasses and optical members having a distribution different from the distribution of the fast axis direction in the off-axis direction shown in FIG. 1C. However, in any case, it is general that a birefringence and its fast axis direction are determined corresponding to a magnitude and a direction of a residual stress.

In the present invention, a birefringence $BR_{OFF}$ observed from the off-axis direction and a fast axis $F_H$ or $F_V$ are present, and a maximum birefringence $BR_{max}$ in the off-axis direction, which is a maximum value in the birefringence $BR_{OFF}$, are important.

Figure 1D:
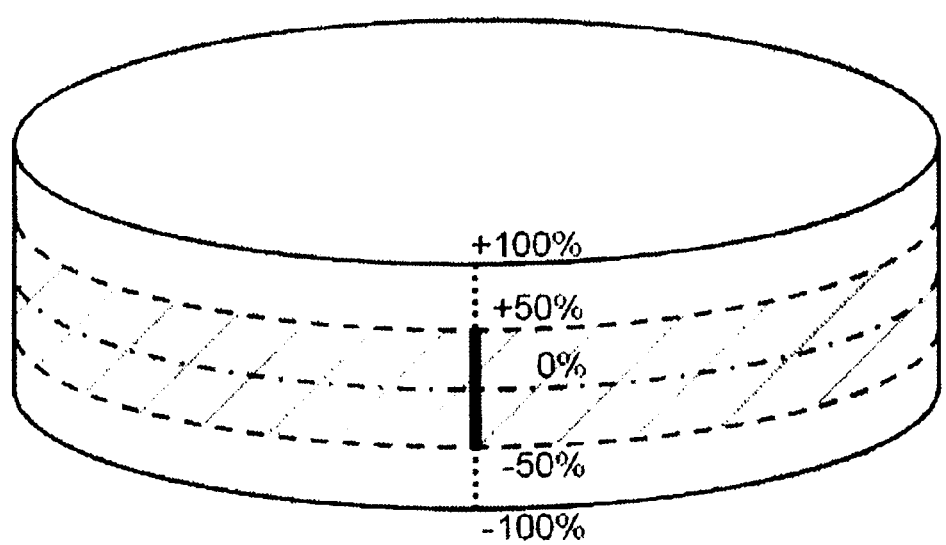
FIG. 1D is a view showing an area for measuring a birefringence in an off-axis direction.

In the present invention, a birefringence existing on a side surface of the cylinder in parallel to the principal optical axis of the synthetic silica glass for optical member and observed on an arbitrary line parallel to the principal optical axis direction (for example, a bold solid line on a side surface of a cylinder described in FIG. 1D) is defined as the birefringence $BR_{OFF}$ in the off-axis direction.

In determining a value of the maximum birefringence $BR_{max}$ in the off-axis direction, in general, on the foregoing evaluation surface, among birefringences measured by scanning on an arbitrary line parallel to the principal optical axis direction, a maximum value of the birefringence $BR_{OFF}$ in the off-axis direction within a certain appointed range is designated as the maximum birefringence $BR_{max}$ in the off-axis direction. Here, in the case where as shown in FIG. 1D, a position of the thickness center of the cylinder is defined as 0%, a position of the upward surface is defined as +100%, and a position of the downward surface is defined as −100%, along the principal optical axis direction, namely the center axis of the cylinder, the appointed range as referred to in the present invention is designated as a range of positions of from −50% to +50%.

Next, the fast axis and the birefringence in the optical axis direction shown by the arrow A in FIG. 1A are explained. The fast axis in the principal optical axis direction means a fast axis measured from a parallel direction to the principal optical axis.

Figure 2:
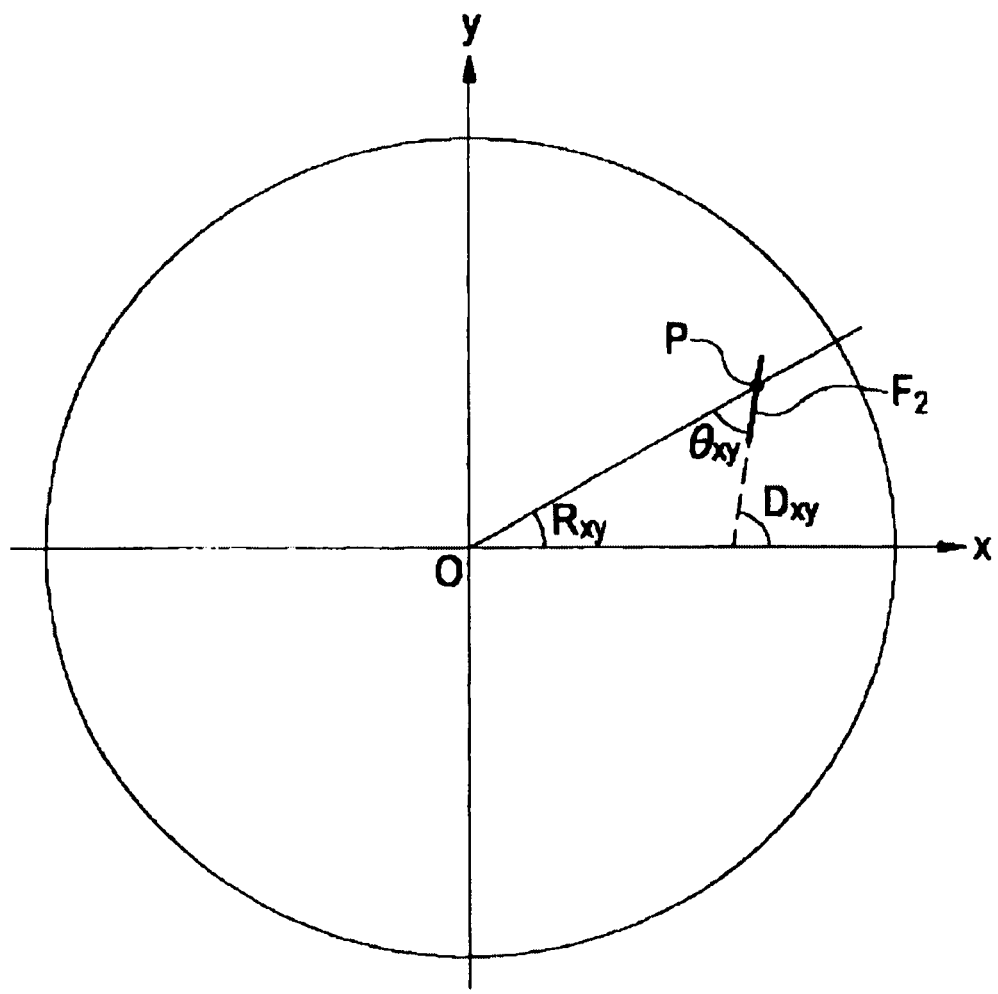
FIG. 2 is a schematic view of a position of an evaluation point of a birefringence in an optical axis direction and a fast axis direction in a synthetic silica glass.

FIG. 2 is a schematic view geometrically showing a position of a birefringence evaluation point and a fast axis direction in the principal optical axis direction on a plane vertical to the optical axis in the synthetic silica glass in FIGS. 1A to 1C, namely a plane shown in FIG. 1B. In FIG. 2, O indicates a position of the central axis of the synthetic silica glass, and this point is designated as an origin of a coordinate system shown in FIG. 2. Also, an X-axis is taken in an arbitrary direction as a coordinate axis passing through the origin O, and a Y-axis is determined as a coordinate axis orthogonal to the X-axis. P indicates an arbitrary birefringence evaluation point; $F_2$ indicates a fast axis in the principal optical axis direction at the birefringence evaluation point P; $R_{xy}$ indicates an angle formed by a straight line connecting the origin O and the birefringence evaluation point P to each other and the X-axis; and $D_{xy}$ indicates an angle formed by the fast axis $F_2$ at the birefringence evaluation point P and the X-axis. A length of the fast axis $F_2$ is designated to indicate a magnitude of the birefringence in the optical axis direction.

In the case where an absolute value of a difference between $R_{xy}$ and $D_{xy}$ at an arbitrary birefringence evaluation point P is 90° or less, a fast axis direction $\theta_{xy}$ at each position on a plane vertical to the optical axis is defined on the basis of the following expression (3). Also, in the case where an absolute value of a difference between $R_{xy}$ and $D_{xy}$ at the birefringence evaluation point P exceeds 90°, $\theta_{xy}$ is defined on the basis of the following expression (4).

In the case of $0° \leq |R_{xy}-D_{xy}| 90°$:

$$\theta_{xy}=|R_{xy}-D_{xy}| \qquad (3)$$

In the case of $90° < |R_{xy}-D_{xy}| \leq 180°$:

$$\theta_{xy}=180-|R_{xy}-D_{xy}| \qquad (4)$$

Figure 3A:
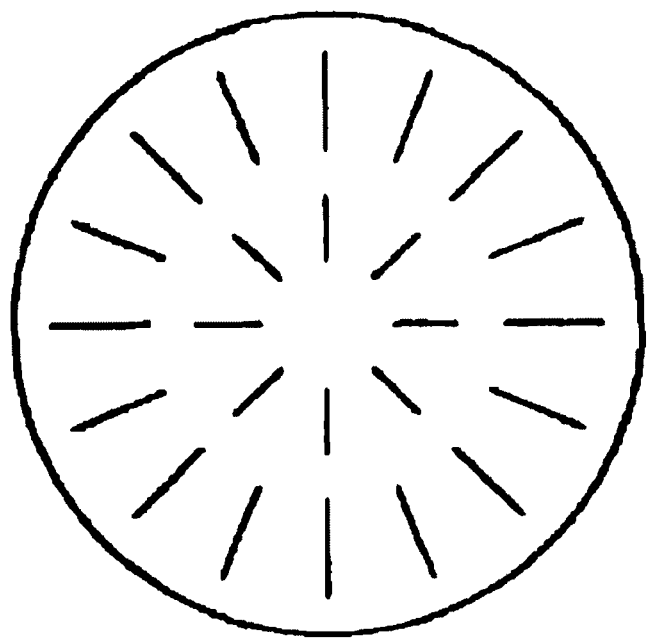
FIG. 3A is a plan view of a synthetic silica glass having a fact fast axis of ideal radial orientation in a birefringence in a synthetic silica glass.
Figure 3B:
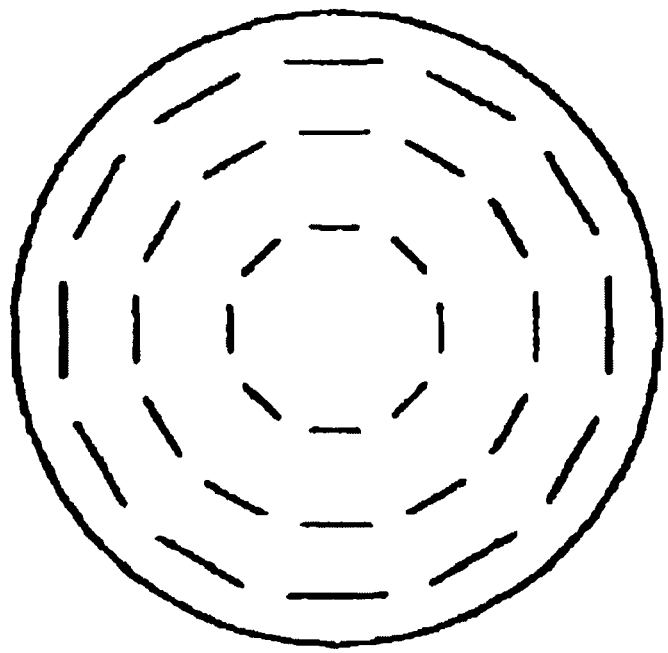
FIG. 3B is a plan view of a synthetic silica glass having a fast axis of ideal concentric tangential orientation in a birefringence in an optical axis direction.

When the fast axis direction $\theta_{xy}$ is defined in this way, $\theta_{xy}$ takes a value falling within the range of 0° or more and 90° or less. In the case where $\theta_{xy}$ is 0° at an arbitrary birefringence evaluation point P, the fast axis shows orientation characteristics of ideal radial orientation as shown in FIG. 3A. Also, in the case where $\theta_{xy}$ is 90°, the fast axis shows orientation characteristics of ideal concentric tangential orientation as shown in FIG. 3B. On the other hand, in the case where $\theta_{xy}$ is an intermediate angle other than those described above, namely $\theta_{xy}$ is a value falling within the range of exceeding 0° and not exceeding 90°, the present invention is classified as follows. The orientation characteristics of the fast axis are defined as radial orientation in the case where $\theta_{xy}$ at an arbitrary birefringence evaluation point P is less than 45°, and as concentric tangential orientation in the case where $\theta_{xy}$ is 45° or more, respectively.

Figure 4:
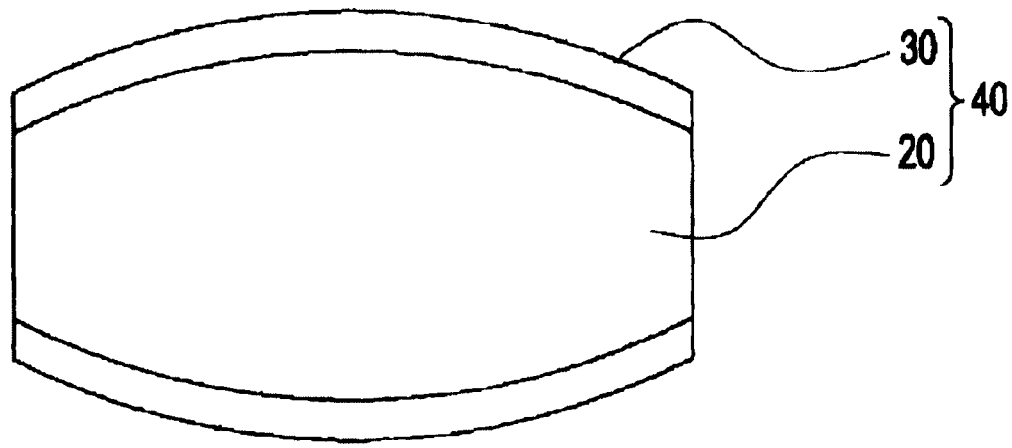
FIG. 4 is a side surface view of an optical member having a functional film imparted thereto (functional film-provided optical member).

Now, examples of the optical member which is used in an exposure apparatus include a synthetic silica glass, quartz crystal which is chiefly used in a site close to a light source and having a strong quantity of light, calcium fluoride, and so on. Furthermore, in addition to the above, for the purpose of reducing a reflection loss on the optical member surface, it is general to subject an antireflection film (AR coat) or a functional film of other kind to film formation on the surface of the optical member. FIG. 4 shows a functional film-provided optical member 40 which is accomplished by coating a functional film (here, an antireflection film) 30 on a biconvex lens 20 as the optical member.

In adjusting the birefringence of the optical member composed of a synthetic silica glass in the principal optical axis direction, in general, attention is not paid to a birefringence at only a specified point such as the birefringence evaluation point P in FIG. 2, but a birefringence in the whole of an optically effective area within a plane vertical to the principal optical axis direction is studied. Here, the optically effective area refers to an area through which the optical axis may actually pass in the optical member and means an area from which a site needed for mechanically supporting the optical member within the exposure apparatus is excluded. More specifically, an area located inside from the outer peripheral surface of the optical member by 10 mm or more is defined as the optically effective area. Then, in the present invention, a value of AveBR cos $2\theta_{xy}$ that is an average of birefringences in the whole of the optically effective area within the plane vertical to the principal optical axis direction is adjusted, thereby obtaining a birefringence in the principal optical axis direction which is suitable when a functional film is imparted.

In determining the value of AveBR cos $2\theta_{xy}$, in general, an average value of BR cos $2\theta_{xy}$ obtained by measuring a birefringence BR and a fast axis direction $\theta_{xy}$ at a birefringence evaluation point P in the optically effective area within a plane vertical to the principal optical axis direction of a synthetic silica glass for optical member and calculating BR cos $2\theta_{xy}$ at the evaluation point P, followed by calculation at all of the evaluation points in the optically effective area is designated as an average birefringence AveBR cos $2\theta_{xy}$ in the optical axis direction. In the present invention, the average birefringence AveBR cos $2\theta_{xy}$ in the optical axis direction is determined by fixing orthogonal lattices at intervals of 10 nm in the optically effective area, designating each of intersection points as the birefringence evaluation point P, and measuring the birefringence BR and the fast axis direction $\theta_{xy}$ at this evaluation point P.

For example, as for a synthetic silica glass for optical member which is used in combination with an optical member composed of calcium fluoride and having a prescribed birefringence, the birefringence in the principal optical axis direction, which is required for the optical member composed of a synthetic silica glass, is not zero, and there may be the case where a value of not zero as an average birefringence in the principal optical axis direction is required so as to approximately compensate the birefringence in the principal optical axis direction of the optical member composed of calcium fluoride. In consequence, it is an important element for obtaining a suitable exposure apparatus to set up the average birefringence in the principal optical axis direction to a prescribed value in conformity with the use state of optical members composed of a synthetic silica glass.

In view of the foregoing circumstances, it is desirable that the average birefringence AveBR cos $2\theta_{xy}$ in the optical axis direction is set up to a range expressed by the following expression (1-1) or expression (1-2).

$$-1.0 \leq \text{AveBR cos } 2\theta_{xy} < 0.0 \quad (1\text{-}1)$$

$$0.0 \leq \text{AveBR cos } 2\theta_{xy} \leq 1.0 \quad (1\text{-}2)$$

Here, each of the numerical values of BR and $\theta_{xy}$ is a measured value at a wavelength of 633 nm, and a unit of BR is nm/cm. As described above, at each one point of the evaluation point P, in the case where $\theta_{xy}$ is 0° or more and less than 45°, a birefringence having a fast axis of radial orientation is defined, and in that case, BR cos $2\theta_{xy}$ takes a positive value. Also, in the case where $\theta_{xy}$ is 45° or more and 90° or less, a birefringence having a fast axis of tangential orientation is defined, and BR cos $2\theta_{xy}$ takes a negative value. On the other hand, following the foregoing matter, in the case where the average birefringence AveBR cos $2\theta_{xy}$ is positive relative to the whole of the optically effective area of the synthetic silica glass for optical member, as expressed by the expression (1-1) and expression (1-2), a birefringence having a fast axis of approximately radial orientation is revealed, and in the case where AveBR cos $2\theta_{xy}$ is negative, a birefringence having a fast phase of approximately tangential orientation is revealed. Incidentally, in the case where AveBR cos $2\theta_{xy}$ falls outside the range of either the expression (1-1) or (1-2), it is extremely difficult to make the integrated birefringence caused due to the matter of passing through all optical members including those other than synthetic silica glasses zero.

When AveBR cos $2\theta_{xy}$ of the optical member is set up to the foregoing range, it is expected that after imparting a specified functional film to the optical member, a functional film-provided optical member having a suitable birefringence in the optical axis direction is obtained.

Furthermore, taking into consideration a combination with quartz crystal, calcium fluoride, or an antireflection film, it is more preferable to set up the average birefringence AveBR cos $2\theta_{xy}$ in the optical axis direction to a range expressed by the following expression (1-3) or expression (1-4) in conformity with the use state of optical members composed of a synthetic silica glass.

$$-0.3 \leq \text{AveBR cos } 2\theta_{xy} < 0.0 \quad (1\text{-}3)$$

$$0.0 < \text{AveBR cos } 2\theta_{xy} \leq 0.3 \quad (1\text{-}4)$$

As described above, in order to make the change in the birefringence before and after processing into a lens shape small, it is desirable to make the birefringence in the off-axis direction small.

Specifically, it is desirable that a maximum birefringence $BR_{max}$ in the off-axis direction, which is a maximum value of the birefringence in the off-axis direction, is set up to a range expressed by the following expression (2-1).

$$0.0 \leq BR_{max} \leq 1.0 \quad (2\text{-}1)$$

When the maximum birefringence $BR_{max}$ in the off-axis direction of the optical member is set up to the foregoing range, an optically preferred optical member can be obtained. On the other hand, when the maximum birefringence $BR_{max}$ in the off-axis direction exceeds the range of the expression (2-1), the birefringence after lens shape processing largely changes, and there is a concern that a difference between a birefringence to be controlled from the viewpoint of optical design and a birefringence of an optical member after actual processing is generated.

Moreover, it is more preferable that the maximum birefringence $BR_{max}$ in the off-axis direction is set up to a range expressed by the following expression (2-2).

$$0.0 \leq BR_{max} \leq 0.5 \quad (2\text{-}2)$$

Here, a numerical value of $BR_{max}$ is a measured value at a wavelength of 633 nm, and a unit of $BR_{max}$ is nm/cm.

Figure 5:
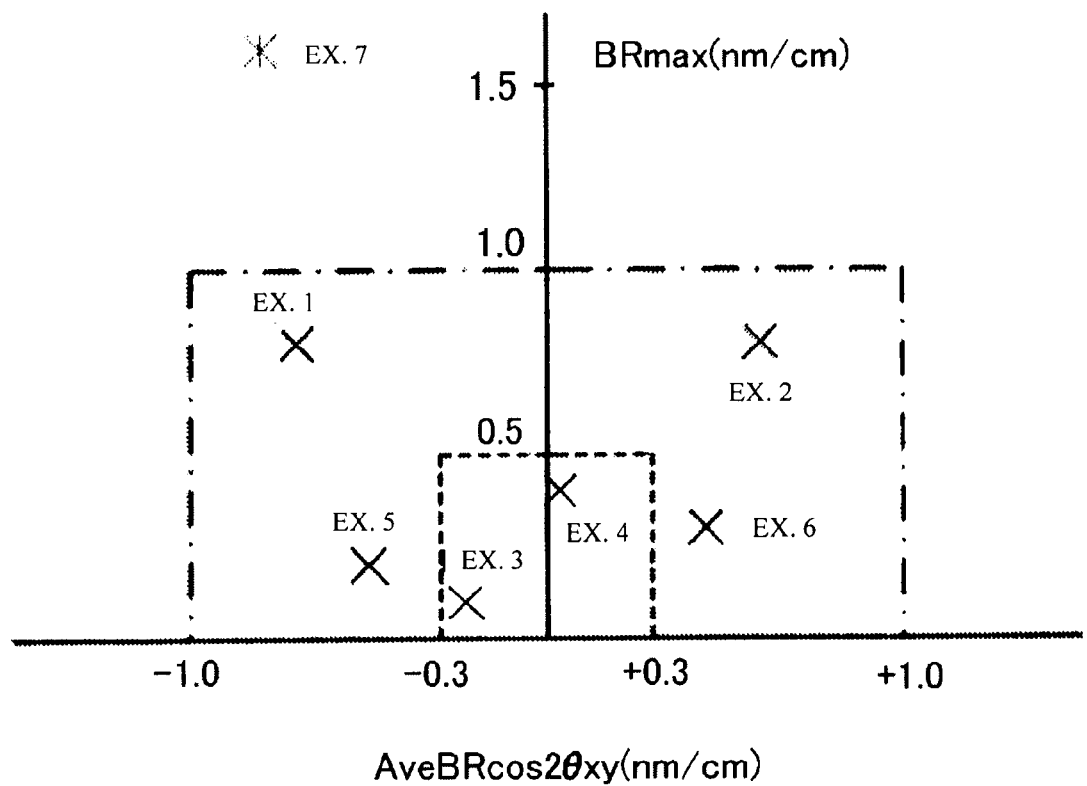
FIG. 5 is a coordinate graph showing preferred ranges of an average birefringence in an optical axis direction and a maximum birefringence in an off-axis direction.

FIG. 5 is a coordinate graph plotting values of an average birefringence in the optical axis direction and a maximum birefringence in the off-axis direction, in which the abscissa indicates an average birefringence AveBR cos $2\theta_{xy}$ in the optical axis direction, and the ordinate indicates a maximum birefringence $BR_{max}$ in the off-axis direction. A range expressed by the alternate long and short dash line is corresponding to the ranges expressed by the foregoing expression (1-1), expression (2-1) and expression (1-2) and is a range of the birefringence in the present invention. Incidentally, (AveBR cos $2\theta_{xy}>0$) is corresponding to the case where the fast axis direction is radical orientation as shown in FIG. 3A, whereas (AveBR cos $2\theta_{xy}<0$) is corresponding to the case where the fast axis direction is tangential orientation as shown in FIG. 3B. Also, a range expressed by the dotted line is corresponding to the ranges expressed by the foregoing expression (1-3), expression (2-2) and expression (1-4) and is a preferred range of the birefringence in the present invention.

In order to set up the foregoing birefringence, it is necessary to control the fast axis direction in the off-axis direction and the principal optical axis direction in a manufacturing step of a synthetic silica glass.

The present inventors have found that in order that the birefringence in the off-axis direction may be reduced, namely the expression (2-1) may be satisfied, and furthermore, the expression (2-2) may be satisfied, it is important to give a heat treatment condition so as to make a temperature gradient in a parallel direction to the principal optical axis direction conspicuously large in the extreme neighborhood of each of the upper and lower surfaces of the synthetic silica glass and small in the inside of the thickness of the synthetic silica glass. According to this matter, a large stress is generated only in the neighborhood of the surface, and it is possible to reduce the birefringence by removing such a portion. Specifically, these can be realized by the following methods.

In a cooling step of a synthetic silica glass molded article, by optimizing a cooling rate in a temperature area effectively acting for extinction and formation of a strain, it becomes possible to make a temperature gradient in a parallel direction to the principal optical axis direction of the synthetic silica glass large in the extreme neighborhood of each of the upper and lower two surfaces thereof and small in an area more inside than the preceding portions. By achieving such a temperature gradient distribution, a strain distribution in the same direction also approximately follows this temperature gradient, whereby a large strain area is formed only in the extreme neighborhood of each of the upper and lower two surfaces of the synthetic silica glass; however, on the other hand, a magnitude of the strain becomes rapidly small in an area more inside than the preceding portions. Therefore, by mechanically or chemically removing a high strain layer in a minute area in neighborhood of the surface, the birefringence in the principal optical axis direction of the finally obtained synthetic silica glass can be reduced. In order to realize such a temperature gradient, it is suitable to perform rapid cooling, and the higher the cooling rate, the thinner the high strain layer is, so that the subsequent removal becomes easy. On the other hand, the case where the cooling rate is excessively high is not preferable for a reason that a burden to a heat treatment furnace or tool, or the like is large, or other reasons. Specifically, in a cooling process in the cooling step, an area for achieving cooling at a cooling rate of 3° C./hour or more is provided. It is desirable that the cooling rate is more preferably 10° C./hour or more. Incidentally, though an upper limit of the cooling rate varies depending upon the state of a heat treatment furnace or tool, it is preferable not more than 100° C./hour. Also, as for the temperature area where this cooling rate is provided, cooling is started from any temperature in the range of 900° C. or higher and 1,200° C. or lower and continued to any temperature of 850° C. or lower. More preferably, it is desirable that this starting temperature is 950° C. or higher and 1,100° C. or lower, and cooling is continued to any temperature of 800° C. or lower.

Also, the present inventors have found that the magnitude of the birefringence in the principal optical axis direction and the fast axis direction are determined by two factors including a cooling rate of the cooling step and a distribution of the OH group concentration contained in the synthetic silica glass. A basic principle related to a relation between the OH group concentration and the fast axis direction is the same as that described in Patent Documents 1 and 2. However, in the present invention, a mutual relation of cause and effect of the cooling condition of the cooling step with the magnitude of the birefringence in the principal optical axis direction and the fast axis direction has been discovered. The control of the magnitude of the birefringence in the principal optical axis direction and the fast axis direction is hereunder explained while separating it into the case of achieving the control such that the fast axis direction becomes tangential orientation, namely the case of performing the control so as to satisfy the expression (1-1), and the case of achieving the control such that the fast axis direction becomes radial orientation, namely the case of performing the control so as to satisfy the expression (1-2), respectively.

Incidentally, the distribution of the OH group concentration in the present invention is herein defined. The OH group concentration is an OH group concentration (unit: wtppm) measured by an absorbed amount of infrared rays from a parallel direction to the principal optical axis direction and is measured by scanning on the diameter of an arbitrary single synthetic silica glass for optical member formed as a cylinder. A coordinate axis r is appointed on the measurement scan straight line, the central axis of the synthetic silica glass is defined as a coordinate origin O, and an effective radius of an outer position of an optically effective area is defined as R. That is, the range of r is from −R to +R. Furthermore, the coordinate axis r is divided by the effective radius R and substituted into a dimensionless coordinate r'. A regression curve of the OH group concentration relative to r' is expressed by a quadratic function of the expression (5). Each of a and b is a fitting parameter. Incidentally, as is clear from the definition of the expression (5), in the case where the OH group concentration distribution has an upward convex shape, the coefficient a (hereinafter also referred to as a quadratic coefficient of the OH group concentration distribution) takes a negative value, whereas in the case where the OH group concentration distribution has a downward convex shape, the coefficient a takes a positive value.

$$Y=ar'^2+b \qquad (5)$$

In the case of performing the control so as to satisfy the expression (1-1), it is preferable that the rapid cooling is started at a temperature of one point of 1,020° C. or higher, and the cooling is performed from that temperature to any temperature of 850° C. or lower at a cooling rate of 3° C./hour or more and 100° C./hour or less. However, when the temperature at which the rapid cooling is started exceeds 1,200° C., the magnitude of the birefringence in the optical axis direction becomes conspicuously large, and therefore, the temperature at which the rapid cooling is started is preferably 1,200° C. or lower. Also, it is more preferable that this rapid cooling process is performed to any temperature of 800° C. or lower. Also, what the rapid cooling rate is faster is effective for controlling the fast axis in the principal optical axis direction to the range of the expression (1-1); and on the other hand, in the case the rapid cooling rate is excessively fast, there is a concern that the magnitude of the birefringence in the same direction becomes large. In consequence, the cooling rate is more preferably 10° C./hour or more and 50° C./hours or less, and still more preferably 15° C./hour or more and 30° C./hour or less.

Incidentally, as for the rapid cooling rate just before the rapid cooling is started, in order to decrease a hypothetical temperature for the purpose of enhancing durability of the synthetic silica glass by irradiation with ultraviolet rays, it would be better to slowly perform cooling, and an average cooling rate of from 1,100° C. to the rapid cooling starting temperature is preferably 1.3° C./hours or less, more preferably 1° C./hour or less, and still more preferably 0.7° C./hour or less. Here, this average cooling rate refers to a value obtained by dividing a difference of the temperature of from 1,100° C. to the rapid cooling starting temperature by a time required for cooling that difference of temperature.

In that case, the quadratic coefficient a of the OH group concentration distribution in the expression (5) of a synthetic silica glass body is desirably −1 ppm or more and not more than +20 ppm.

Furthermore, in order to satisfy the expression (1-3), it is preferable that the foregoing rapid cooling starting temperature is 1,020° C. or higher and lower than 1,050° C., this cooling rate is continued to a temperature of not higher than 850° C., and the quadratic coefficient a of the OH group concentration distribution is −1 ppm or more and less than +5 ppm. A more preferred range is that the rapid cooling starting temperature is 1,030° C. or higher and 1,040° C. or lower, the cooling is continued to a temperature of 800° C. or less, and the quadratic coefficient a of the OH group concentration distribution is −1 ppm or more and +3 ppm or less.

In the case of performing the control so as to satisfy the expression (1-2), it is preferable that the rapid cooling is started at a temperature of one point of 900° C. or higher and lower than 1,020° C., and the cooling is performed from that temperature to any temperature of 850° C. or lower at a cooling rate of 3° C./hour or more and 100° C./hour or less.

The temperature at which the rapid cooling is started is more preferably 930° C. or higher and 1,000° C. or lower, and the cooling is more preferably continued to any temperature of 800° C. or lower. In the case of controlling the fast axis direction to radial orientation, there is a concern that when the rapid cooling is too fast, the fast axis direction becomes tangential orientation, and therefore, the cooling rate is more preferably 3° C./hour or more and 30° C./hour or less, and still more preferably 3° C./hour or more and 10° C./hour or less.

Incidentally, as for the cooling rate just before the rapid cooling is started, in order to decrease a hypothetical temperature for the purpose of enhancing durability of the synthetic silica glass by irradiation with ultraviolet rays, it would be better to slowly perform cooling, and the cooling rate is preferably 1° C./hours or less, more preferably 0.5° C./hour or less, and still more preferably 0.2° C./hour or less.

In that case, the quadratic coefficient a of the OH group concentration distribution in the expression (5) of the synthetic silica glass body is desirably −22 ppm or more and less than −1 ppm.

Furthermore, in order to satisfy the expression (1-4), it is preferable that the rapid cooling starting temperature is 950° C. or higher and lower than 1,020° C., the cooling is continued to a temperature of 850° C. or lower, and the quadratic coefficient a of the OH group concentration distribution is −7 ppm or more and less than −1 ppm. A more preferred range is that the rapid cooling starting temperature is 960° C. or higher and 1,000° C. or lower, the cooling is continued to a temperature of 800° C. or lower, and the quadratic coefficient a of the OH group concentration distribution is −5.5 ppm or more and less than −1.0 ppm.

Moreover, for the purpose of reducing the optical path integrated birefringence in the case of containing an optical member composed of other material than the synthetic silica glass, for example, quartz crystal, calcium fluoride, or the like, in the same optical system, there may be the case where it is desirable that an average birefringence in an optical axis direction of a synthetic silica glass for optical member satisfies a range slightly far from zero as shown below, depending upon the birefringence of the optical member composed of other material than the synthetic silica glass to be combined.

$$-0.6 \leq AveBR \cos 2\theta_{xy} < -0.3 \quad (1\text{-}5)$$

$$+0.3 < AveBR \cos 2\theta_{xy} \leq +0.6 \quad (1\text{-}6)$$

Incidentally, each of the numerical values described in the expression (1-5) and the expression (1-6) has a unit of nm/cm and is a value measured by light having a wavelength of 633 nm.

In order to allow the average birefringence in the optical axis direction to fall within the range of the expression (1-5), control of the rapid cooling starting temperature is effective, the rapid cooling starting temperature is preferably 1,050° C. or higher and 1,100° C. or lower, and the cooling is preferably continued to a temperature of 850° C. or lower. Furthermore, it is more preferable that the rapid cooling starting temperature is 1,060° C. or higher and 1,080° C. or lower, and the cooling is continued to a temperature of 800° C. or lower. On the other hand, as for the distribution shape of the OH group concentration, though the foregoing quadratic coefficient a may be in the range of 0 ppm or more and not more than +11 ppm, it is more preferably +5 ppm or more and not more than +8 ppm.

On the other hand, in order to satisfy the expression (1-6), control by the rapid cooling starting temperature is not effective so much, but control of the quadratic coefficient a of the OH group concentration distribution is effective. The quadratic coefficient a of the OH group concentration distribution is preferably −13 ppm or more and less than −7 ppm, and more preferably −9 ppm or more and not more than −8 ppm. A preferred range of the rapid cooling starting temperature is the same as the range satisfying the expression (1-4), the rapid cooling starting temperature is preferably 950° C. or higher and lower than 1,020° C., and the cooling is preferably continued to a temperature of 850° C. or lower. Furthermore, it is more preferable that the rapid cooling starting temperature is 960° C. or higher and 1,000° C. or lower, and the cooling is continued to a temperature of 800° C. or lower.

The OH group concentration distribution in the synthetic silica glass can be controlled by a bulk density of a porous silica glass body (a mass per apparent unit volume of the porous silica glass body) and a temperature and a time of a dehydration step of the porous silica glass body. The dehydration step refers to a step in which just before dense vitrification of a porous silica glass body synthesized by subjecting a gaseous raw material to flame hydrolysis, moisture is removed under reduced pressure or in vacuo at a high temperature.

For example, in order to obtain a quadratic coefficient a of the OH group concentration distribution of −1 ppm or more and less than +5 ppm, it is preferable that a porous silica glass body having a bulk density of 0.30 g/cm³ or more and 0.45 g/cm³ or less is used, the temperature is set up to 1,100° C. or higher and 1,250° C. or lower, and the porous silica glass body is held in a reduced pressure atmosphere of 50 Pa or less for 60 hours or more. However, when the porous silica glass body is held for approximately 100 hours or more, there is a concern that a reducing defect is caused, and therefore, it is desirable that an upper limit is 95 hours.

Also, in order to obtain a quadratic coefficient a of the OH group concentration distribution of −7 ppm or more and less than −1 ppm, it is preferable that a porous silica glass body having a bulk density of 0.20 g/cm³ or more and less than 0.30 g/cm³ is used and held for a holding time of 40 hours or more and less than 60 hours while adopting the same temperature and pressure as those described above.

Also, in order to allow a quadratic coefficient a of the OH group concentration distribution to fall within the range of 0 ppm or more and not more than +11 ppm, it is preferable that a porous silica glass body having a bulk density of 0.33 g/cm³ or more and 0.55 g/cm³ or less is used and held for a holding time of 65 hours or more and 95 hours or less while adopting the same temperature and pressure as those described above.

Also, in order to allow a quadratic coefficient a of the OH group concentration distribution to fall within the range of −13 ppm or more and not more than −7 ppm, it is preferable that a porous silica glass body having a bulk density of 0.15 g/cm³ or more and less than 0.30 g/cm³ is used and held for a holding time of 20 hours or more and less than 40 hours while adopting the same temperature and pressure as those described above.

However, the foregoing numerical values of the bulk density and conditions of the dehydration step are merely shown as preferred ranges, and it should not be construed that the present invention is limited to the foregoing ranges or techniques.

Incidentally, in the present invention, a measurement method of the bulk density of the porous silica glass body is performed in the following way. A diameter and a length of a porous silica glass body having an approximately cylindrical shape immediately after being obtained by gas phase reaction synthesis are measured by using a non-contact type measuring device, thereby calculating a volume. Thereafter, a heat treatment is performed by holding in an atmospheric atmosphere at 1,350° C. for 3 hours; a substrate and the like to be used during the synthesis and growth are completely removed; and thereafter, a weight of the porous synthetic silica glass body is measured by a platform scale. This weight is divided by the previously calculated volume to determine the bulk density.

Also, it is preferable that the optical member of the present invention has a refractive index distribution Δn in the principal optical axis direction of $2 \times 10^{-6}$ nm/cm or less and a refractive index distribution Δn in the off-axis direction of $5 \times 10^{-6}$ nm/cm or less relative to light having a wavelength of 633 nm. According to such a constitution, deterioration of a wave from aberration of each of a component in the principal optical axis direction and a vertical component thereto is suppressed, thereby contributing to an enhancement of imaging characteristics of an exposure apparatus.

Also, a maximum value of the OH group concentration of the optical member is preferably 100 ppm or less, more preferably 70 ppm or less, and still more preferably 50 ppm or less. According to such a constitution, it becomes possible to provide an optical member composed of a synthetic silica glass having high laser durability. It is said that the OH group deeply participates in laser durability of an optical member composed of a synthetic silica glass used in an exposure apparatus, and by reducing the OH group, an optical member having excellent laser durability can be provided.

The OH group concentration is measured in the following way. In an inside area excluding an area of 10 mm from an outer edge of a synthetic silica glass relative to a vertical surface to the principal optical axis, the measurement is performed at intervals of 10 mm by an infrared spectrophotometer, thereby determining an OH group concentration from an absorption peak at a wavelength of 2.7 μm (J. P. Williams, et al., American Ceramic Society Bulletin, 55(5), 524, 1976). A detection limit according to the present method is 0.1 ppm.

EXAMPLES

As specific examples of the present invention, a working example and a comparative example are hereunder described. Examples 1 to 6 are concerned with a working example, and Example 7 is concerned with a comparative example.

Example 1

SiCl$_4$ was introduced into an oxyhydrogen flame, and silica glass fine particles synthesized in the flame were deposited on a substrate, thereby forming a porous silica glass body. The obtained porous silica glass body had a bulk density of 0.34 g/cm$^3$.

This porous silica glass body was held in a reduced pressure atmosphere of 5 Pa at 1,250° C. for 90 hours, and thereafter, it was subjected to temperature elevation to 1,500° C. and held for 3 hours to achieve transparent vitrification, thereby obtaining a transparent silica glass body.

The transparent silica glass body was subjected to molding processing by heating at 1,700° C., thereby obtaining a molded silica glass body having been molded in a cylinder.

Subsequently, as a cooling step, the molded silica glass body was subjected to temperature elevation to 1,300° C. and held for 20 hours. Thereafter, the resulting molded silica glass body was cooled from 1,300° C. to 1,150° C. at 2° C./hour, from 1,150° C. to 1,080° C. at 1° C./hour, and then from 1,080° C. to 780° C. at 7° C./hour, thereby obtaining a synthetic silica glass body.

The thus-obtained synthetic silica glass body was measured with respect to an OH group concentration, a birefringence and a refractive index distribution within a vertical plane to a principal optical axis direction, and a birefringence and a refractive index distribution in an off-axis direction. In an area of an effective diameter of the synthetic silica glass body, the OH group concentration was measured at intervals of 10 mm by a Fourier transformation infrared spectrometer. Also, the birefringence was measured at each of intersection points of orthogonal lattices at intervals of 10 nm at a wavelength of 633 nm by using a birefringence evaluation system (Model No.: ABR10A, manufactured by Uniopt Corporation, Ltd.) utilizing a heterodyne method. A maximum value of the OH group concentration was 32.2 ppm, and the OH group concentration distribution was subjected to fitting with the expression (5) by a least square method, thereby determining a quadratic coefficient a thereof. As a result, it was +10.3 ppm. Also, an average birefringence AveBR cos $2\theta_{xy}$ in the optical axis direction was −0.7 nm/cm, and a refractive index distribution Δn in the optical axis direction was $1.0 \times 10^{-6}$. On the other hand, a maximum birefringence in the off-axis direction was 0.8 nm/cm, and a refractive index distribution Δn in the off-axis direction was $1.4 \times 10^{-6}$.

Example 2

A porous silica glass body was formed in the same manner as that in Example 1. However, the formation was performed at a total flow rate of a combustible gas and an assist gas by −10% as compared with that in Example 1. The obtained porous silica glass body had a bulk density of 0.24 g/cm$^3$.

This porous silica glass body was held in a reduced pressure atmosphere of 5 Pa at 1,250° C. for 35 hours, and thereafter, it was subjected to temperature elevation to 1,500° C. and held for 3 hours to achieve transparent vitrification, thereby obtaining a transparent silica glass body.

The transparent silica glass body was subjected to molding processing by heating at 1,700° C., thereby obtaining a molded silica glass body having been molded in a cylinder.

Subsequently, as a cooling step, the molded silica glass body was subjected to temperature elevation to 1,300° C. and held for 20 hours. Thereafter, the resulting molded silica glass body was cooled from 1,300° C. to 1,150° C. at 2° C./hour, from 1,150° C. to 1,050° C. at 1° C./hour, from 1,050° C. to 950° C. at 0.5° C./hour, and then from 950° C. to 780° C. at 4° C./hour, thereby obtaining a synthetic silica glass body.

The thus obtained synthetic silica glass body was measured in the same manners as those in Example 1. As a result, a maximum value of the OH group concentration was 14.9 ppm; a quadratic coefficient a of the OH group concentration distribution was −11.8 ppm; an average birefringence AveBR cos $2\theta_{xy}$ in the optical axis direction was +0.6 nm/cm; and a refractive index distribution Δn in the optical axis direction was $1.1 \times 10^{-6}$. On the other hand, a maximum birefringence in the off-axis direction was 0.8 nm/cm, and a refractive index distribution Δn in the off-axis direction was $3.3 \times 10^{-6}$.

Example 3

A porous silica glass body was formed in the same manner as that in Example 1.

This porous silica glass body was held in a reduced pressure atmosphere of 5 Pa at 1,250° C. for 70 hours, and thereafter, it was subjected to temperature elevation to 1,500° C. and held for 3 hours to achieve transparent vitrification, thereby obtaining a transparent silica glass body.

The transparent silica glass body was subjected to molding processing by heating at 1,700° C., thereby obtaining a molded silica glass body having been molded in a cylinder.

Subsequently, as a cooling step, the molded silica glass body was subjected to temperature elevation to 1,300° C. and held for 20 hours. Thereafter, the resulting molded silica glass body was cooled from 1,300° C. to 1,150° C. at 2° C./hour, from 1,150° C. to 1,050° C. at 1° C./hour, from 1,050° C. to 1,030° C. at 0.5° C./hour, and then from 1,030° C. to 780° C. at 20° C./hour, thereby obtaining a synthetic silica glass body.

The thus obtained synthetic silica glass body was measured in the same manners as those in Example 1. As a result, a maximum value of the OH group concentration was 23.4 ppm; a quadratic coefficient a of the OH group concentration distribution was +2.1 ppm; an average birefringence AveBR $\cos 2\theta_{xy}$ in the optical axis direction was −0.23 nm/cm; and a refractive index distribution Δn in the optical axis direction was $0.4 \times 10^{-6}$. On the other hand, a maximum birefringence in the off-axis direction was 0.1 nm/cm, and a refractive index distribution Δn in the off-axis direction was $4.6 \times 10^{-6}$.

Example 4

A porous silica glass body was formed in the same manner as that in Example 1. However, the formation was performed at a total flow rate of a combustible gas and an assist gas by −4% as compared with that in Example 1. The obtained porous silica glass body had a bulk density of 0.28 g/cm³.

This porous silica glass body was held in a reduced pressure atmosphere of 5 Pa at 1,250° C. for 48 hours, and thereafter, it was subjected to temperature elevation to 1,500° C. and held for 3 hours to achieve transparent vitrification, thereby obtaining a transparent silica glass body.

The transparent silica glass body was subjected to molding processing by heating at 1,700° C., thereby obtaining a molded silica glass body having been molded in a cylinder.

Subsequently, as a cooling step, the molded silica glass body was subjected to temperature elevation to 1,300° C. and held for 20 hours. Thereafter, the resulting molded silica glass body was cooled from 1,300° C. to 1,150° C. at 2° C./hour, from 1,150° C. to 1,050° C. at 1° C./hour, from 1,050° C. to 990° C. at 0.5° C./hour, and then from 990° C. to 780° C. at 10° C./hour, thereby obtaining a synthetic silica glass body.

The thus obtained synthetic silica glass body was measured in the same manners as those in Example 1. As a result, a maximum value of the OH group concentration was 19.1 ppm; a quadratic coefficient a of the OH group concentration distribution was −2.0 ppm; an average birefringence AveBR $\cos 2\theta_{xy}$ in the optical axis direction was +0.04 nm/cm; and a refractive index distribution Δn in the optical axis direction was $0.1 \times 10^{-6}$. On the other hand, a maximum birefringence in the off-axis direction was 0.4 nm/cm, and a refractive index distribution Δn in the off-axis direction was $3.1 \times 10^{-6}$.

Example 5

A porous silica glass body was formed in the same manner as that in Example 1.

This porous silica glass body was held in a reduced pressure atmosphere of 5 Pa at 1,250° C. for 80 hours, and thereafter, it was subjected to temperature elevation to 1,500° C. and held for 3 hours to achieve transparent vitrification, thereby obtaining a transparent silica glass body.

The transparent silica glass body was subjected to molding processing by heating at 1,700° C., thereby obtaining a molded silica glass body having been molded in a cylinder.

Subsequently, as a cooling step, the molded silica glass body was subjected to temperature elevation to 1,300° C. and held for 20 hours. Thereafter, the resulting molded silica glass body was cooled from 1,300° C. to 1,150° C. at 2° C./hour, from 1,150° C. to 1,050° C. at 1° C./hour, and then from 1,050° C. to 780° C. at 25° C./hour, thereby obtaining a synthetic silica glass body.

The thus obtained synthetic silica glass body was measured in the same manners as those in Example 1. As a result, a maximum value of the OH group concentration was 25.8 ppm; a quadratic coefficient a of the OH group concentration distribution was +5.4 ppm; an average birefringence AveBR $\cos 2\theta_{xy}$ in the optical axis direction was −0.5 nm/cm; and a refractive index distribution Δn in the optical axis direction was $0.5 \times 10^{-6}$. On the other hand, a maximum birefringence in the off-axis direction was 0.2 nm/cm, and a refractive index distribution Δn in the off-axis direction was $3.5 \times 10^{-6}$.

Example 6

A porous silica glass body was formed in the same manner as that in Example 1. However, the formation was performed at a total flow rate of a combustible gas and an assist gas by −7% as compared with that in Example 1. The obtained porous silica glass body had a bulk density of 0.26 g/cm³.

This porous silica glass body was held in a reduced pressure atmosphere of 5 Pa at 1,250° C. for 48 hours, and thereafter, it was subjected to temperature elevation to 1,500° C. and held for 3 hours to achieve transparent vitrification, thereby obtaining a transparent silica glass body.

The transparent silica glass body was subjected to molding processing by heating at 1,700° C., thereby obtaining a molded silica glass body having been molded in a cylinder.

Subsequently, as a cooling step, the molded silica glass body was subjected to temperature elevation to 1,300° C. and held for 20 hours. Thereafter, the resulting molded silica glass body was cooled from 1,300° C. to 1,150° C. at 2° C./hour, from 1,150° C. to 1,050° C. at 1° C./hour, from 1,050° C. to 960° C. at 0.5° C./hour, and then from 960° C. to 780° C. at 10° C./hour, thereby obtaining a synthetic silica glass body.

The thus obtained synthetic silica glass body was measured in the same manners as those in Example 1. As a result, a maximum value of the OH group concentration was 17.3 ppm; a quadratic coefficient a of the OH group concentration distribution was −8.1 ppm; an average birefringence AveBR $\cos 2\theta_{xy}$ in the optical axis direction was +0.45 nm/cm; and a refractive index distribution Δn in the optical axis direction was $0.8 \times 10^{-6}$. On the other hand, a maximum birefringence in the off-axis direction was 0.3 nm/cm, and a refractive index distribution Δn in the off-axis direction was $4.0 \times 10^{-6}$.

Example 7

A molded silica glass body was obtained in the same manner as that in Example 1.

A rapid cooling starting temperature in a cooling step was set up to a temperature lower than 900° C. That is, the molded silica glass body was subjected to temperature elevation to 1,300° C. and held for 20 hours. Thereafter, the resulting molded silica glass body was cooled from 1,300° C. to 1,150° C. at 2° C./hour, from 1,150° C. to 1,050° C. at 1° C./hour, and then from 1,050° C. to 880° C. at 0.5° C./hour, and thereafter, further cooled from 880° C. to 780° C. at 7° C./hour, thereby obtaining a synthetic silica glass body.

The thus obtained synthetic silica glass body was measured in the same manners as those in Example 1. As a result, a maximum value of the OH group concentration was 31.0 ppm; a quadratic coefficient a of the OH group concentration distribution was +8.8 ppm; an average birefringence AveBR $\cos 2\theta_{xy}$ in the optical axis direction was −0.8 nm/cm; and a refractive index distribution Δn in the optical axis direction was $1.0 \times 10^{-6}$. On the other hand, a maximum birefringence in the off-axis direction was 1.6 nm/cm, and a refractive index distribution Δn in the off-axis direction was $2.2 \times 10^{-6}$.

The experimental conditions and results of Examples 1 to 7 are summarized in Table 1 and Table 2, respectively.

TABLE 1

| | | Dehydration step | | Cooling step | |
|---|---|---|---|---|---|
| | Bulk density (g/cm³) | Temperature (° C.) | Time (hr) | Starting temperature (° C.) | Rate (° C./hr) |
| Example 1 | 0.34 | 1250 | 90 | 1080 | 7 |
| Example 2 | 0.24 | 1250 | 35 | 950 | 4 |
| Example 3 | 0.34 | 1250 | 70 | 1030 | 20 |
| Example 4 | 0.28 | 1250 | 48 | 990 | 10 |
| Example 5 | 0.34 | 1250 | 80 | 1050 | 25 |
| Example 6 | 0.26 | 1250 | 48 | 960 | 10 |
| Example 7 | 0.34 | 1250 | 90 | 880 | 7 |

TABLE 2

| | | Optical axis direction | | | | Off-axis direction | |
|---|---|---|---|---|---|---|---|
| | | OH group concentration | | | Refractive | | Refractive |
| | Fast axis | Maximum value (ppm) | Quadratic coefficient a (ppm) | AveBRcos2θ$_{xy}$ (nm/cm) | index distribution (ppm) | BR$_{max}$ (nm/cm) | index distribution (ppm) |
| Example 1 | Tangential orientation | 32.2 | +10.3 | −0.7 | 1.0 | 0.8 | 1.4 |
| Example 2 | Radial orientation | 14.9 | −11.8 | 0.6 | 1.1 | 0.8 | 3.3 |
| Example 3 | Tangential orientation | 23.4 | +2.1 | −0.23 | 0.4 | 0.1 | 4.6 |
| Example 4 | Radial orientation | 19.1 | −2.0 | 0.04 | 0.1 | 0.4 | 3.1 |
| Example 5 | Tangential orientation | 25.8 | +5.4 | −0.5 | 0.5 | 0.2 | 3.5 |
| Example 6 | Radial orientation | 17.3 | −8.1 | +0.45 | 0.8 | 0.3 | 4.0 |
| Example 7 | Tangential orientation | 31.0 | +8.8 | −0.8 | 1.0 | 1.6 | 2.2 |

Industrial Applicability

The optical member of the present invention is used for the manufacture of various members such as lenses, prisms, photomasks, window materials, and the like of optical apparatuses having a variety of light sources and is useful for providing a suitable optical apparatus.

Description Of Reference Numerals And Signs

| O: | Position of central axis of synthetic silica glass |
|---|---|
| P: | Birefringence evaluation point |
| F$_H$: | Fast axis in off-axis direction parallel to upper and lower surfaces |
| F$_V$: | Fast axis in off-axis direction parallel to principal optical axis direction |
| F$_2$: | Fast axis in principal axis direction at birefringence evaluation point P |
| D$_{xy}$: | Angle formed by fast axis F$_2$ at birefringence evaluation point P and X-axis |
| R$_{xy}$: | Angle formed by straight line connecting origin O and birefringence evaluation point P to each other and X-axis |
| 10: | Synthetic silica glass |
| 20: | Biconvex lens |
| 30: | Functional film (antireflection film) |
| 40: | Functional film-provided optical member |

The invention claimed is:

1. A synthetic silica glass for optical member to be used within an optical apparatus using light having a wavelength of 250 nm or less as a light source, wherein, in an optically effective area within a vertical plane to a principal optical axis direction of the optical member, an average value of a value BR cos2θ$_{xy}$ defined from a birefringence BR and a fast axis direction θ$_{xy}$ as measured from a parallel direction to the principal optical axis direction is defined as an average birefringence AveBR cos2θ$_{xy}$, and when a maximum value of a birefringence measured from a vertical direction to the principal optical axis direction of the optical member is defined as a maximum birefringence BR$_{max}$ in an off-axis direction, the following expression (1-1) and expression (2-1) are established, and a refractive index distribution Δn in the principal optical axis direction is $2 \times 10^{-6}$ nm/cm or less, and a refractive index distribution Δn in the off-axis direction is $5 \times 10^{-6}$ nm/cm or less, provided that each of the numerical values of BR, θ$_{xy}$, BR$_{max}$ and Δn is a measured value at a wavelength of 633 nm, and a unit of the birefringence is nm/cm:

$$-1.0 \leq \text{AveBR} \cos2\theta_{xy} < 0.0 \quad (1\text{-}1)$$

$$0.0 \leq \text{BR}_{max} \leq 1.0 \quad (2\text{-}1).$$

2. A synthetic silica glass for optical member to be used within an optical apparatus using light having a wavelength of 250 nm or less as a light source, wherein, in an optically effective area within a vertical plane to a principal optical axis direction of the optical member, an average value of a value BR cos2θ$_{xy}$ defined from a birefringence BR and a fast axis direction θ$_{xy}$ as measured from a parallel direction to the principal optical axis direction is defined as an average birefringence AveBR cos2θ$_{xy}$, and when a maximum value of a birefringence measured from a vertical direction to the principal optical axis direction of the optical member is defined as a maximum birefringence $BR_{max}$ in an off-axis direction, the following expression (1-2) and expression (2-1) are established, and a refractive index distribution Δn in the principal optical axis direction is $2\times10^{-6}$ nm/cm or less, and a refractive index distribution Δn in the off-axis direction is $5\times10^{-6}$ nm/cm or less, provided that each of the numerical values of BR, $\theta_{xy}$, $BR_{max}$ and Δn is a measured value at a wavelength of 633 nm, and a unit of the birefringence is nm/cm:

$$0.0 < \text{AveBR} \cos 2\theta_{xy} \leq 1.0 \quad (1\text{-}2)$$

$$0.0 \leq BR_{max} \leq 1.0 \quad (2\text{-}1).$$

3. The synthetic silica glass for optical member according to claim 1, wherein the average birefringence AveBR $\cos 2\theta_{xy}$ in the optical axis direction and the maximum birefringence $BR_{max}$ in the off-axis direction satisfy the following expression (1-3) and expression (2-2), respectively:

$$-0.3 \leq \text{AveBR} \cos 2\theta_{xy} < 0.0 \quad (1\text{-}3)$$

$$0.0 \leq BR_{max} \leq 0.5 \quad (2\text{-}2).$$

4. The synthetic silica glass for optical member according to claim 2, wherein the average birefringence AveBR $\cos 2\theta_{xy}$ in the optical axis direction and the maximum birefringence $BR_{max}$ in the off-axis direction satisfy the following expression (1-4) and expression (2-2), respectively:

$$0.0 < \text{AveBR} \cos 2\theta_{xy} \leq 0.3 \quad (1\text{-}4)$$

$$0.0 \leq BR_{max} \leq 0.5 \quad (2\text{-}2).$$

5. A method for manufacturing the synthetic silica glass for optical member according to claim 1, the method comprising:

a treatment of cooling from any temperature of 900° C. or higher and 1,200° C. or lower to any temperature of 850° C. or lower at a cooling rate of 3° C./hour or more and 100° C./hour or less.

6. A method for manufacturing the synthetic silica glass for optical member according to claim 1, the method comprising:

a treatment of cooling from any temperature of 1,020° C. or higher and 1,200° C. or lower to any temperature of 850° C. or lower at a cooling rate of 3° C./hour or more and 100° C./hour or less.

7. A method for manufacturing the synthetic silica glass for optical member according to claim 3, the method comprising:

a treatment of holding a porous silica glass body having a bulk density of 0.30 g/cm³ or more and 0.45 g/cm³ or less at a temperature of 1,100° C. or higher and 1,250° C. or lower in a reduced pressure atmosphere of 50 Pa or less for 60 hours or more, thereby achieving dehydration; and a treatment of cooling a transparent silica glass molded article from any temperature of 1,020° C. or higher and 1,050° C. or lower to any temperature of 850° C. or lower at a cooling rate of 3° C./hour or more and 100° C./hour or less.

8. A method for manufacturing the synthetic silica glass for optical member according to claim 2, the method comprising:

a treatment of cooling from any temperature of 900° C. or higher and lower than 1,020° C. to any temperature of 850° C. or lower at a cooling rate of 3° C./hour or more and 100° C./hour or less.

9. A method for manufacturing the synthetic silica glass for optical member according to claim 4, the method comprising:

a treatment of holding a porous silica glass body having a bulk density of 0.20 g/cm³ or more and 0.30 g/cm³ or less at a temperature of 1,100° C. or higher and 1,250° C. or lower in a reduced pressure atmosphere of 50 Pa or less for 40 hours or more and 60 hours or less, thereby achieving dehydration; and a treatment of cooling a transparent silica glass molded article from any temperature of 1,050° C. or higher and 1,100° C. or lower to any temperature of 850° C. or lower at a cooling rate of 3° C./hour or more and 100° C./hour or less.

10. A method for manufacturing the synthetic silica glass for optical member according to claim 2, the method comprising:

a treatment of cooling from any temperature of 900° C. or higher and 1,200° C. or lower to any temperature of 850° C. or lower at a cooling rate of 3° C./hour or more and 100° C./hour or less.

* * * * *